United States Patent
Moon et al.

(10) Patent No.: US 6,825,065 B2
(45) Date of Patent: Nov. 30, 2004

(54) METHOD FOR OPTICAL MODULE PACKAGING OF FLIP CHIP BONDING

(75) Inventors: Jong-tae Moon, Iksan (KR); Yong-sung Eom, Daejon (KR)

(73) Assignee: Electronics and Telecommunications Research Institute, Daejon (KR)

( * ) Notice: Subject to any disclaimer, the term of this patent is extended or adjusted under 35 U.S.C. 154(b) by 0 days.

(21) Appl. No.: 10/632,589

(22) Filed: Aug. 1, 2003

(65) Prior Publication Data
US 2004/0023437 A1 Feb. 5, 2004

Related U.S. Application Data

(62) Division of application No. 10/185,103, filed on Jun. 27, 2002, now Pat. No. 6,707,161.

(30) Foreign Application Priority Data

Nov. 29, 2001 (KR) ........................................ 2001-74952

(51) Int. Cl.[7] ............................................... H01L 21/44
(52) U.S. Cl. ...................................... 438/108; 257/778
(58) Field of Search ................................. 438/108, 116, 438/612, 613, 629, 637; 257/734, 737, 778, 779

(56) References Cited

U.S. PATENT DOCUMENTS

| | | | |
|---|---|---|---|
| 5,463,229 A | | 10/1995 | Takase et al. |
| 6,127,736 A | | 10/2000 | Akram |
| 6,396,116 B1 | | 5/2002 | Kelly et al. |
| 6,450,699 B1 | | 9/2002 | Murali et al. |
| 6,571,466 B1 | * | 6/2003 | Glenn et al. .................. 29/841 |
| 2001/0023979 A1 | | 9/2001 | Brouvillette et al. |
| 2002/0102060 A1 | | 8/2002 | Jewell et al. |
| 2002/0113958 A1 | | 8/2002 | Wilsher et al. |
| 2002/0118924 A1 | | 8/2002 | Murata |
| 2002/0164113 A1 | | 11/2002 | Rensing et al. |
| 2002/0175339 A1 | | 11/2002 | Raj et al. |

OTHER PUBLICATIONS

IEEE Transactions on Advanced Packaging, vol. 23, No. 2, May 2000, pp. 198–205.
Optical Fiber Array, 5 pages.
2001 Electronic Components and Technology Conference, 6 pages.

* cited by examiner

*Primary Examiner*—David Nelms
*Assistant Examiner*—David Vu
(74) *Attorney, Agent, or Firm*—Blakely Sokoloff Taylor & Zafman

(57) ABSTRACT

A method for flip-chip-bonded optical module packaging is presented. An optical device chip including an input/output pad formed on a substrate, an under bump metal layer formed on the input/output pad, and a solder bump formed on the under bump metal layer to transmit an electric signal to the outside is prepared. A silicon wafer is prepared to rearrange input/output terminals of the chip and passively align an optical fiber with the optical device chip. Through holes are formed in the silicon wafer at predetermined intervals. An under ball metal layer is formed at the surface of the silicon wafer. A solder ball is formed on the under ball metal layer to transmit a signal to the outside. The optical device chip is flip-chip-bonded to the silicon wafer. An optical sub module is made by cutting the silicon wafer. The chip is optically connected with the optical sub module.

5 Claims, 7 Drawing Sheets

METHOD FOR OPTICAL MODULE PACKAGING OF FLIP CHIP BONDING

RELATED APPLICATION

The application is a divisional of U.S. patent application Ser. No. 10/185,103, filed Jun. 27, 2002, now U.S. Pat. No. 6,707,161 by Applicants, Jong-Tae Moon and Yong-Sung Eom, and entitled "Optical Module Package of Flip Chip Bonding (As Amended)."

BACKGROUND

1. Field of the Invention

The present invention relates to an optical module package and a packaging method thereof, and more particularly, to a flip-chip-bonded optical module package and a packaging method thereof.

2. Description of the Related Art

In most cases, if electric signals of an optical device are allowed to be transmitted to the outside of the optical device by a conventional wire-bonding method and a chip of the optical device operates at a high speed of no less than 20 Gbps, electric parasitic components increase and the chip cannot show its desired speed. Accordingly, a flip chip bonding method capable of minimizing the distance between the chip of an optical device and a substrate, which are electrically connected to each other, must be used to minimize parasitic components between the chip of an optical device and the substrate.

FIG. 1 is a flowchart illustrating a conventional method of packaging an optical module using flip chip bonding. Referring to FIG. 1, a chip of an optical device is manufactured instep 10. Next, solder balls, which transmit electric signals to the outside of the optical device chip, are deposited on a silicon wafer in step 12. Next, the optical device chip is bonded to the silicon wafer by flip chip bonding in step 14.

The silicon wafer, onto which a plurality of optical device chips are flip-chip-bonded, is cut, thereby forming an optical sub modules in step 16. Next, an optical fiber is coupled with the optical device chip of the optical sub module in the manner of active alignment, thereby completing a flip-chip-bonded optical module package in step 18. In order to actively align the optical device chip of the optical sub module with the optical fiber, the optical device is aligned with the optical fiber to provide a position at which the efficiency of the optical device chip to be optically coupled with the optical fiber is highest, and the optical device is fixed to the optical fiber using a laser welding method.

However, in the conventional method of packaging an optical module using flip chip bonding, the step of actively aligning the optical device chip of the optical sub module with the optical fiber requires much time and large expenditures. Accordingly, a new method, which is simpler and requires less expenditures than the conventional method of packaging an optical module using flip chip bonding, is required.

SUMMARY OF THE INVENTION

To solve the above-described problems, it is a first object of the present invention to provide a flip-chip-bonded optical module package which is capable of ensuring the electrical characteristics of a high speed optical device chip and easily increasing the efficiency of the optical device chip to be optically coupled with an optical fiber.

It is a second object of the present invention to provide a method of packaging an optical, module using flip chip bonding which is capable of ensuring the electrical characteristics of a high speed optical device chip and easily increasing the efficiency of the optical device chip to be optically coupled with an optical fiber.

Accordingly, to achieve the first object, there is provided a flip-chip-bonded optical module package. The flip-chip-bonded optical module package includes an optical device chip which is comprised of an input/output pad formed on a substrate, an under bump metal layer formed on the input/output pad, and a solder bump formed on the under bump metal layer to transmit an electric signal to the outside. The flip-chip-bonded optical module package includes a silicon wafer through which a through hole is formed, on which an under ball metal layer is formed, and to which the optical device chip is flip-chip-bonded. The flip-chip-bonded optical module package includes a solder ball which is formed on the under ball metal layer and transmits an electrical signal from the solder bump to the outside, and an optical fiber which is inserted into the through hole and is optically coupled with the optical device chip. The through hole may be filled with an index matching material to increase the efficiency of the optical device chip coupled with the optical fiber. A lens may be inserted into the through hole to increase the efficiency of the optical device chip coupled with the optical fiber.

To achieve the second object, there is provided a method of packaging an optical module using flip chip bonding. An optical device chip, which is comprised of an input/output pad formed on a substrate, an under bump metal layer formed on the input/output pad, and a solder bump formed on the under bump metal layer to transmit an electric signal to the outside, is prepared. A silicon wafer is prepared to rearrange input/output terminals of the optical device chip and passively align an optical fiber with the optical device chip. A plurality of through holes are formed in the silicon wafer at predetermined intervals. An under ball metal layer is formed at the surface of the silicon wafer. A solder ball is formed on the under ball metal layer to transmit an electrical signal from the solder bump to the outside. The optical device chip is flip-chip-bonded to the silicon wafer. An optical sub module is manufactured by cutting the silicon wafer. The optical device chip is optically coupled with the optical sub module by inserting the optical fiber into the through hole of the optical sub module to be aligned with the optical device chip.

Preparing the optical device chip may include manufacturing optical devices each including an input/output pad formed on a substrate, forming an under bump metal layer on the input/output pad, forming a solder bump on the under bump metal layer on the input/output pad, and obtaining an individual optical device chip by cutting the substrate, on which the solder bump is formed.

The through hole may be formed by wet-etching or dry-etching the silicon wafer or polishing the back side of the silicon wafer and wet-etching or dry-etching the silicon wafer. The silicon wafer may be cut into individual wafers, on each of which an array of a plurality of optical device chips is formed. The optical fiber may be inserted into the through hole of the optical sub module in the manner of passive alignment, in which there is no need to operate an optical device.

As described above, according to the present invention, it is possible to sufficiently satisfy the electrical characteristics of a high speed optical device chip with the use of a flip chip bonding method. In addition, since an optical fiber is aligned with and inserted into a silicon wafer through a plurality of through holes formed perforating the semiconductor substrate, it is possible to increase the efficiency of an optical device chip to be optically coupled with the optical fiber.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE INVENTION

Figure 1:
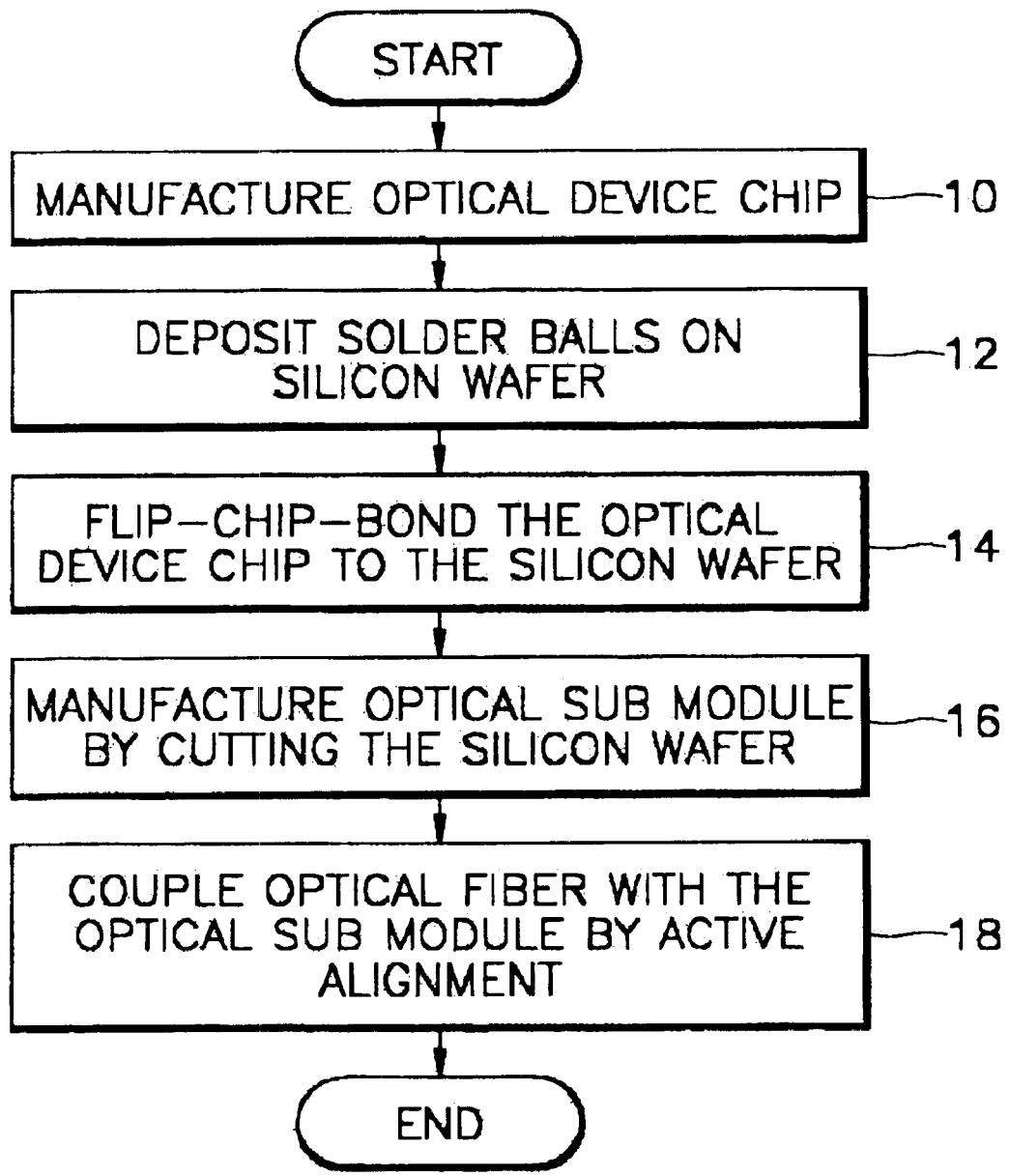
FIG. 1 is a flowchart illustrating a conventional method of packaging an optical module using flip chip bonding.

The present invention will now be described more fully with reference to the accompanying drawings, in which a preferred embodiment of the invention is shown. This invention may, however, be embodied in many different forms and should not be construed as being limited to the embodiment set forth herein. Rather, this embodiment is provided so that this disclosure will be thorough and complete, and will fully convey the concept of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present.

Figure 2:
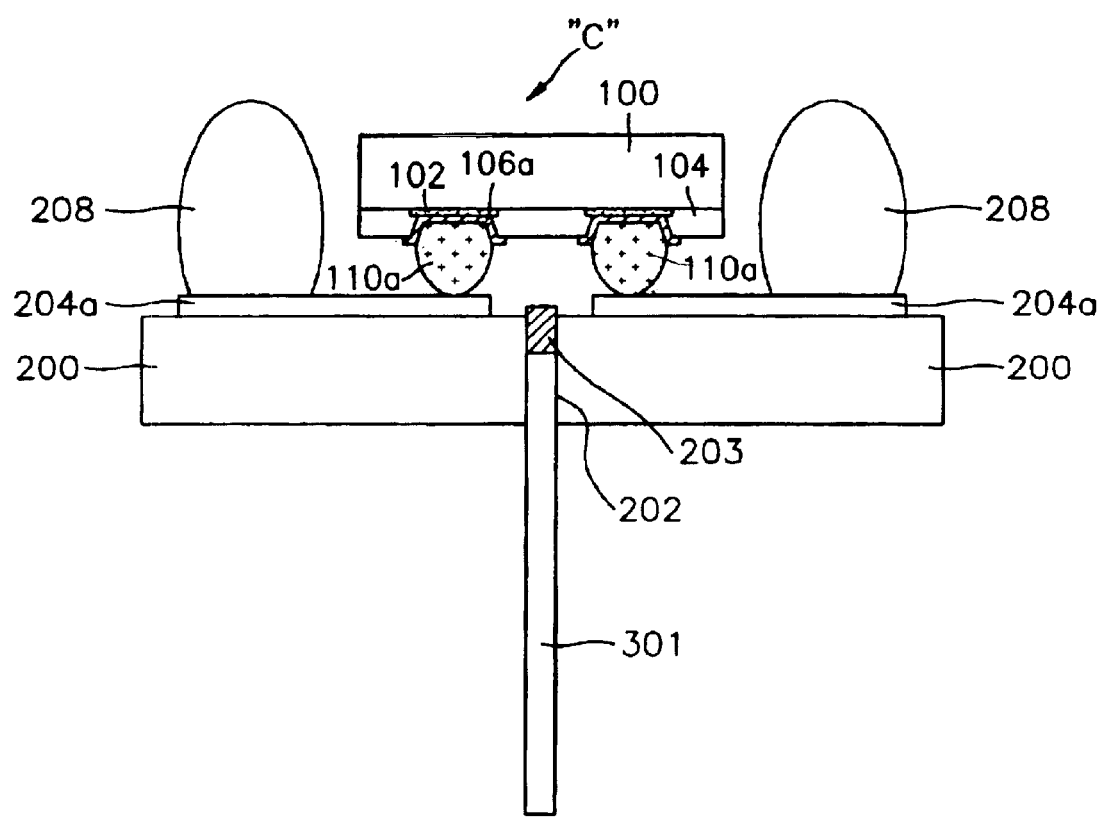
FIG. 2 is a cross-sectional view of a flip-chip-bonded optical module package according to the present invention.

FIG. 2 is a cross-sectional view of a flip-chip-bonded optical module package according to the present invention. A flip-chip-bonded optical module package, in which an optical device chip (C) is flip-chip-bonded to a silicon wafer 200, is illustrated in FIG. 2. However, an array of four or eight optical device chips is flip-chip-bonded to a silicon wafer in a flip-chip-bonded optical module package. Specifically, the flip-chip-bonded optical module package according to the present invention includes the optical device chip (C), the silicon wafer 200, which is flip-chip-bonded to the optical device chip (C) and has a through hole 202 formed at its center, and an optical fiber 301, which is coupled with the optical device chip (c), being inserted into the through hole 202 and transmits an optical signal.

The optical device chip (C) includes an input/output pad 102, which is formed on a substrate 100, an under bump metal layer pattern 106a, which is formed on the input/output pad 102 to be capable of being electroplated, and a solder bump 110a, which is formed on the under bump metal layer pattern 106a and transmits an electrical signal to the outside of the optical device chip (C).

The solder bump 110a of the optical device chip (c) is connected to the under ball metal layer pattern 204a, which is formed at the surface of the silicon wafer 200, and the under ball metal layer pattern 204a is connected to a solder ball 208 to transmit an electric signal to the outside of the optical device chip (c). The optical device chip (c) is flip-chip-bonded to the silicon wafer 200, and the silicon wafer 200 serves to obtain the electrical characteristics of the optical device chip (C).

The silicon wafer 200 includes the through hole 202, which helps the optical fiber 301 to be easily inserted into the silicon wafer 200 when aligning the optical fiber 301 with the silicon wafer 200. The through hole 202, into which the optical fiber 301 is inserted, allows the optical fiber 301 to be easily aligned with the silicon wafer 200 and be fixed to the silicon wafer 200. The efficiency of the optical fiber 301 to be coupled with the silicon wafer 200 can be increased by inserting a lens at reference 203 into the through hole 202 or filling the through hole 202 with an index matching material at reference 203, such as epoxy.

Figure 3:
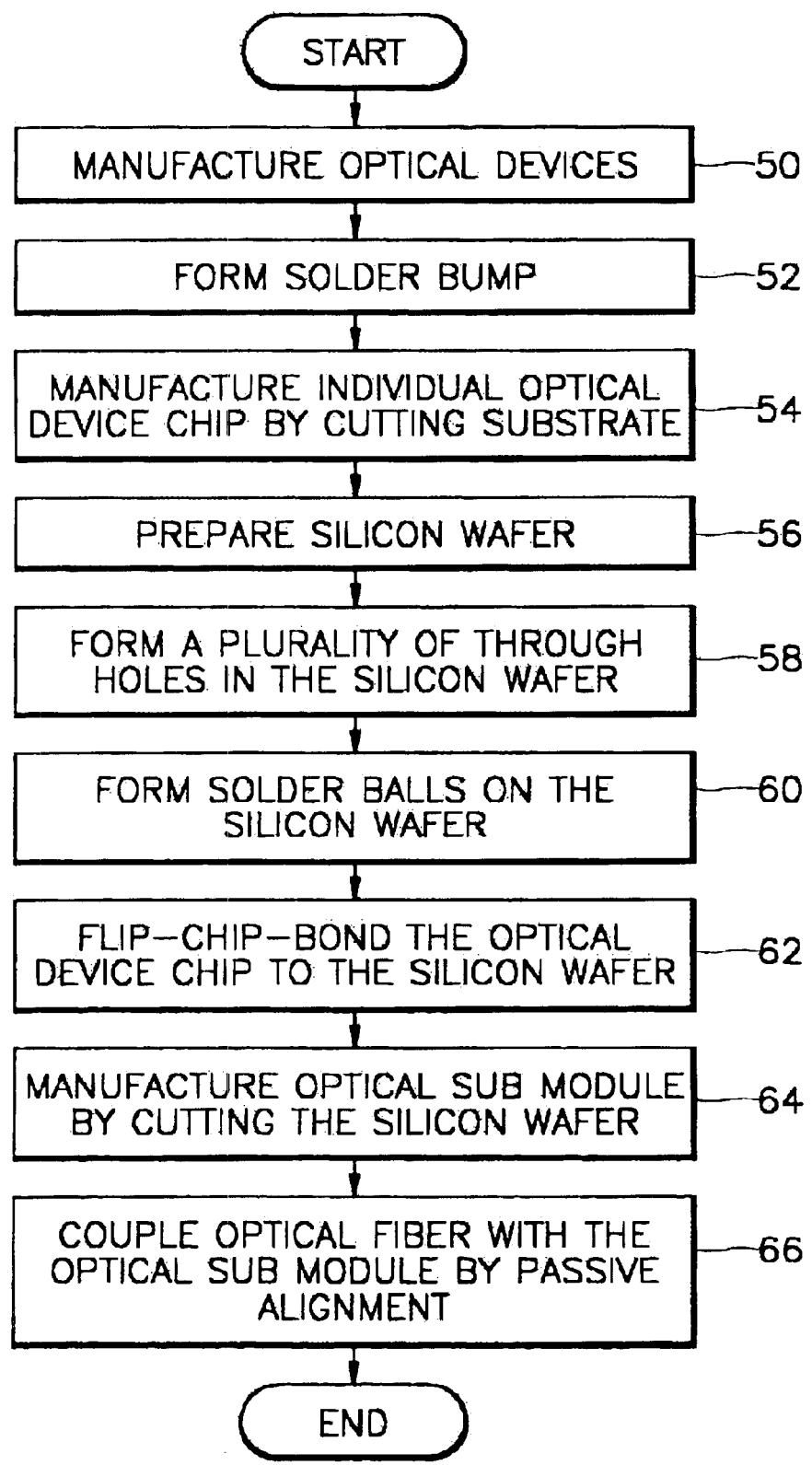
FIG. 3 is a flowchart illustrating a method of packaging an optical module using flip chip bonding according to the present invention.

FIG. 3 is a flowchart illustrating a method of packaging an optical module using flip chip bonding according to the present invention. Referring to FIG. 3, a plurality of optical devices are manufactured on a GaAs substrate in step 50. An under bump metal layer is formed on input/output terminals of the optical devices, thereby forming a solder bump of no greater than 100 microns instep 52. The substrate, on which the optical devices are formed, is diced, thereby forming individual optical device chips in step 54.

In order to rearrange the input/output terminals of each of the optical device chips, a silicon wafer is prepared in step 56. In order to passively align an optical fiber with the silicon wafer, a plurality of through holes are formed in the silicon wafer at predetermined intervals in step 58. In order to rearrange the input/output terminals of each of the optical device chips, an under ball metal layer is formed on the silicon wafer, thereby forming a solder ball in step 60. A through hole is formed at the center of each individual optical device chip to be formed by cutting the silicon wafer, and solder balls are formed at either side of the optical device chip.

Next, each of the optical device chips is flip-chip-bonded to the silicon wafer in step 62. In other words, the solder bump of each of the optical device chips is flip-chip-bonded to the under ball metal layer of the silicon wafer. Accordingly, the optical device chips are flip-chip-bonded to the silicon wafer.

Next, the silicon wafer, to which the optical device chips are flip-chip-bonded, is cut, thereby manufacturing optical sub modules in step 64. The optical sub modules may be formed by cutting the silicon wafer into parts, on each of which one optical device chip is formed, or cutting the silicon wafer into parts, on each of which an array of four or eight optical device chips is formed for multi-channels.

Next, an optical fiber is inserted into the through hole of the silicon wafer from the bottom of the semiconductor substrate in the manner of passive alignment in step 66 so that the optical fiber can be fixed to the silicon wafer and can be connected to the corresponding optical device chip. The passive alignment method, in which the optical fiber is aligned with the optical device chip with the use of the through hole without operating the optical device chip, unlike in an active alignment method, can obtain the electrical characteristics of a high speed optical device chip, increase the efficiency of the optical device chip to be coupled with the optical fiber, and decrease the time taken to couple the optical fiber with the optical device chip.

FIGS. 4 through 9 are cross-sectional views illustrating a method of manufacturing an optical device chip of FIG. 3. Actually, optical device chips are manufactured by the wafer level. However, the manufacture of only one optical device chip is illustrated in FIGS. 4 through 9.

Figure 4:
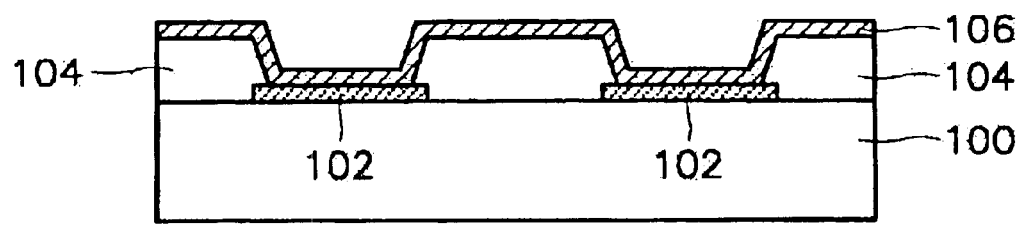
FIGS. 4 through 9 are cross-sectional views illustrating a method of manufacturing an optical chip of FIG. 3.

Referring to FIG. 4, an optical device including an input/output pad 102 and an insulating layer for insulating the input/output pad 102 is manufactured on a substrate 100, for example, a GaAs substrate. The insulating layer 104 is formed of a nitride layer. Next, an under bump metal layer 106 is formed on the entire surface of the substrate 100, on which the input/output pad 102 and the insulating layer 104 have been formed, by sputtering to be capable of being electroplated.

Figure 5:
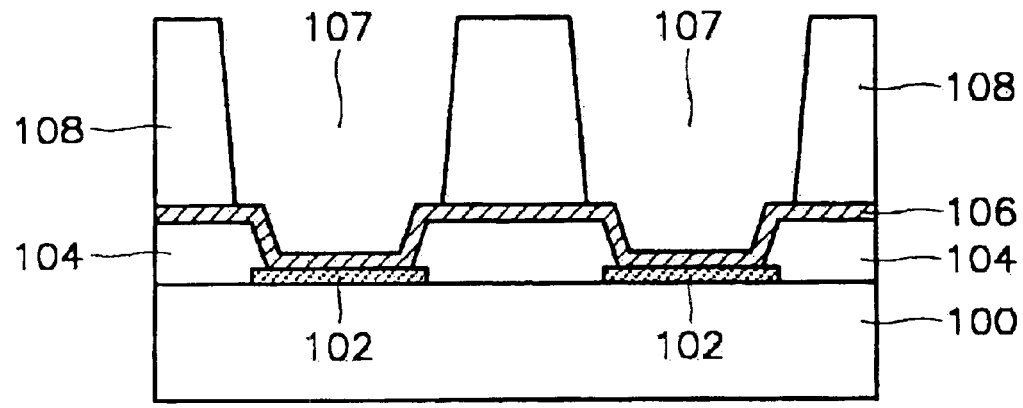

Referring to FIG. 5, a photoresist pattern 108 having a hole 107, through which a predetermined portion of the under bump metal layer 106 on the input/output pad 102 is exposed, is formed on the under bump metal layer 106. In other words, the photoresist pattern 108 is formed by forming a photoresist layer on the under bump metal layer 106 and patterning the photoresist layer using photolithography.

Figure 6:
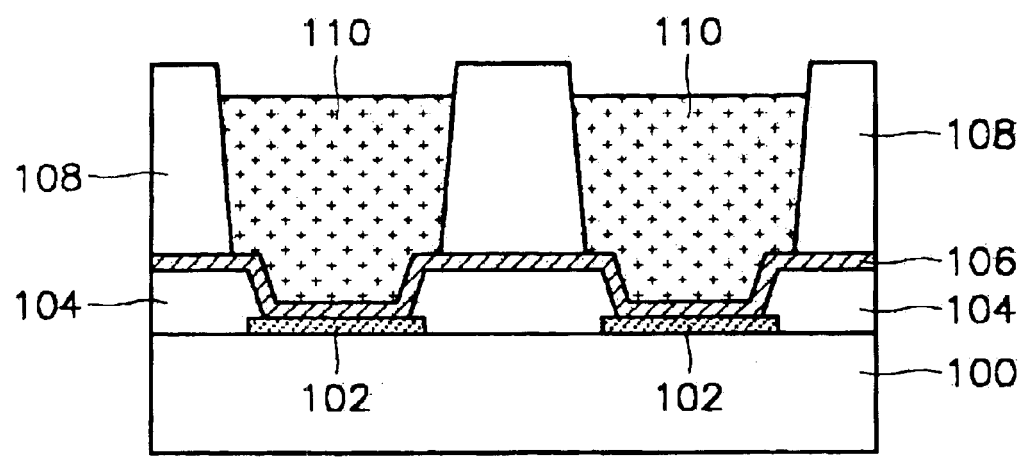
Figure 7:
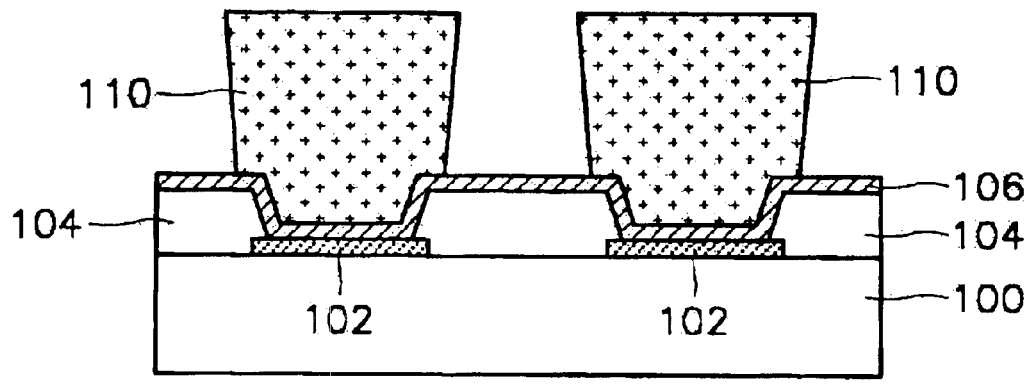

Referring to FIGS. 6 and 7, a solder layer 110 is formed to a predetermined height in the hole 107 on the under bump metal layer 106 on the input/output pad 102 by electroplating. Next, the photoresist pattern 108 is removed.

Figure 8:
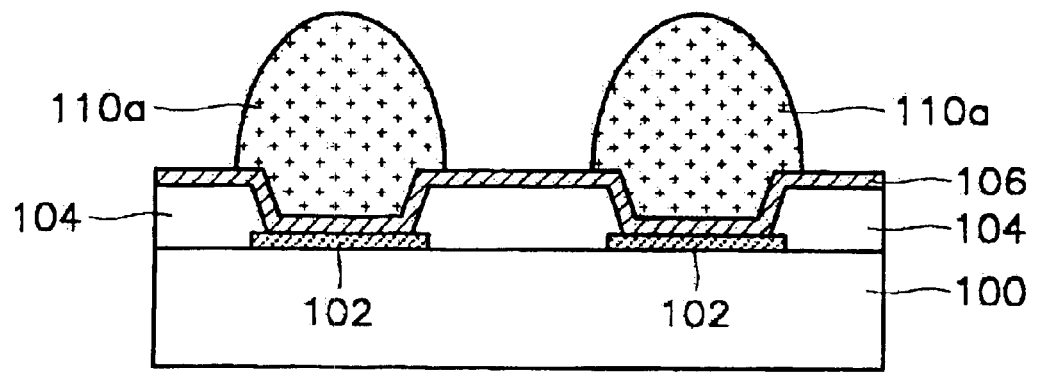

Referring to FIG. 8, a solder bump 110a of no greater than 100 microns is formed in a hemispherical shape on the under bump metal layer 106 on the input/output pad 102 by applying heat to the substrate 100 electroplated with the solder layer 110. The solder bump 110a is used to transmit an electrical signal of an optical device to the outside of the optical device.

Figure 9:
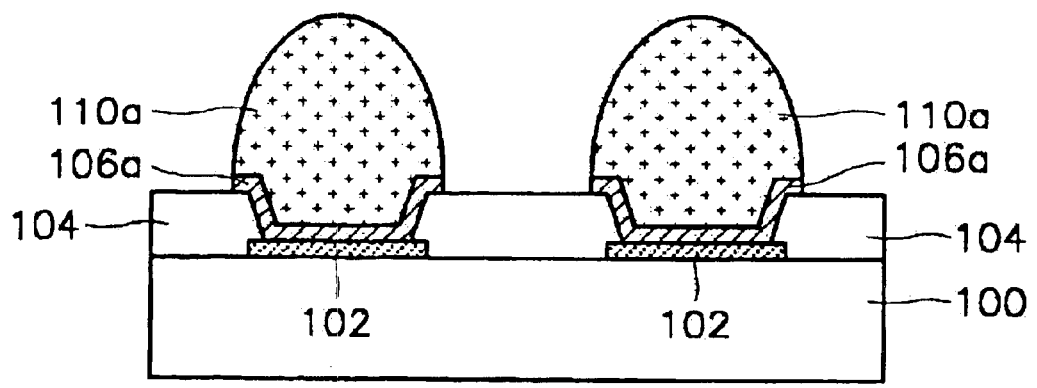

Referring to FIG. 9, the under bump metal layer 106 is patterned, thereby forming an under bump metal layer pattern 106a under the solder bump 110a. The substrate 100, on which the solder bump 110a has been formed, is diced, thereby forming individual optical device chips.

FIGS. 10 through 15 are cross-sectional views illustrating a method of manufacturing a silicon wafer having through holes of FIG. 3. A silicon wafer illustrated in FIGS. 10 through 15 is actually manufactured by the wafer. However, the silicon wafer, which corresponds to one optical device chip, is illustrated in FIGS. 10 through 15 for the convenience of illustration.

Figure 10:
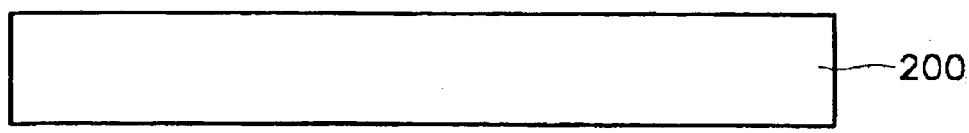
FIGS. 10 through 15 are cross-sectional views illustrating a method of manufacturing a silicon wafer having a plurality of through holes of FIG. 3.

Referring to FIG. 10, a silicon wafer 200 is prepared. The silicon wafer 200 is prepared to rearrange input/output terminals of the optical device chip manufactured by the method described above with reference to FIGS. 4 through 9 and to passively align an optical fiber with the optical device chip in the subsequent step.

Figure 11:
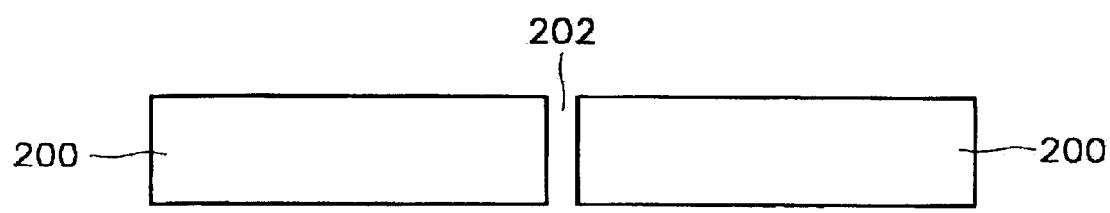

Referring to FIG. 11, a plurality of through holes 202 are formed in the silicon wafer 200 at predetermined intervals so that optical fibers can be inserted into the through holes 202. The through holes 202 may be formed by dry-etching or wet-etching the silicon wafer 200. Alternatively, the through holes 202 may be formed by etching the back side of the silicon wafer 200 to be thin and dry-etching or wet-etching the silicon wafer 200. The through holes 202 are formed in the silicon wafer 200 to correspond to the center of their respective optical device chips formed on the silicon wafer 200.

Figure 12:
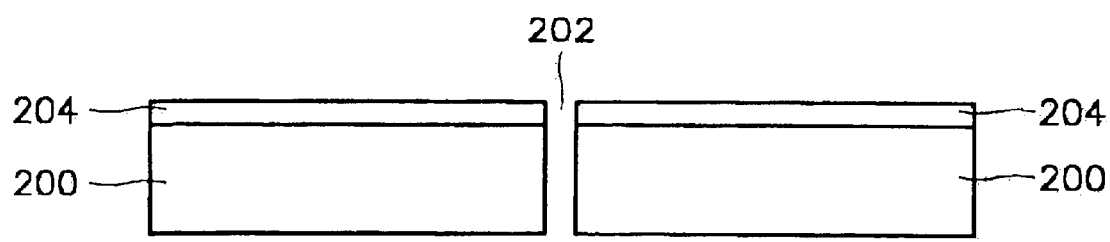

Referring to FIG. 12, an under ball metal layer 204 is formed on the entire surface of the silicon wafer 200, in which the through holes 202 have been formed, by electroplating.

Figure 13:
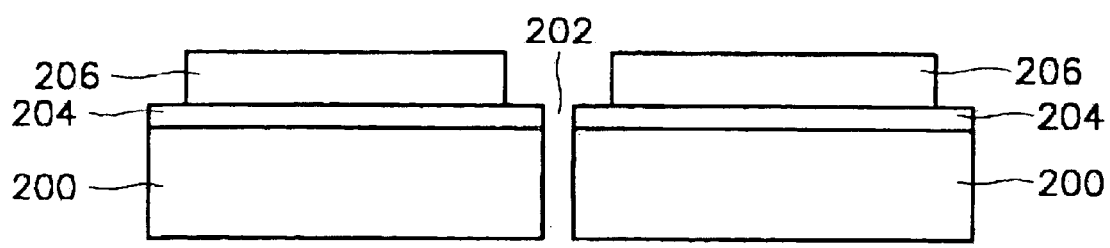
Figure 14:
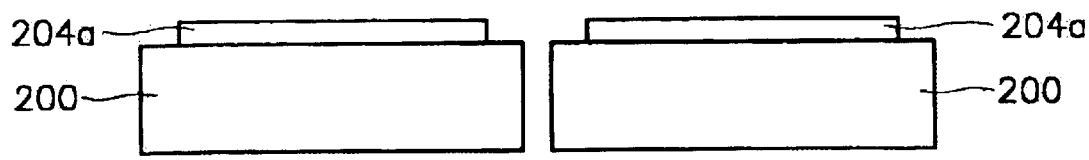

Referring to FIGS. 13 and 14, the under ball metal layer 204 is patterned using a photoresist pattern 206, thereby forming an under ball metal layer pattern 204a. The under ball metal layer pattern 204a is used to determine a position, at which the solder bump 110a and a solder ball 208 to be formed are located.

Figure 15:
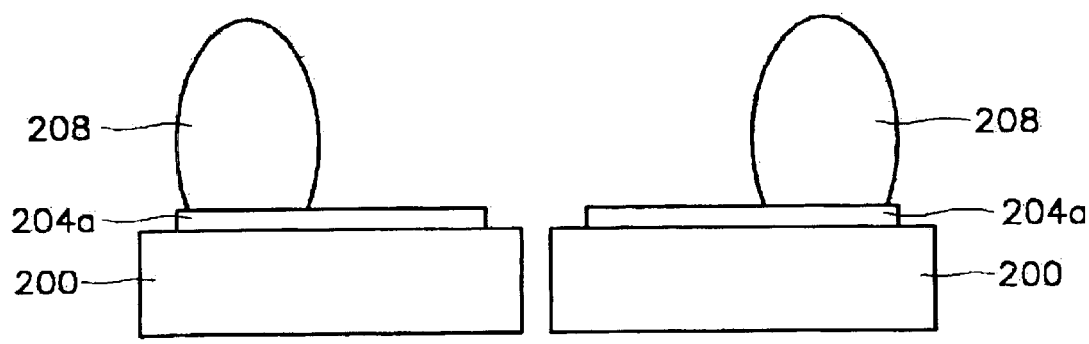

Referring to FIG. 15, the solder ball 208 of no less than 300 microns is mounted on the under ball metal layer pattern 204a on the silicon wafer 200 by a pick-and-place method.

Hereinafter, a method of passively aligning an optical fiber with an optical device chip manufactured by the method described above with reference to FIGS. 4 through 9 after the optical device chip is flip-chip-bonded to a silicon wafer formed by the method described above with reference to FIGS. 10 through 15.

Figure 16:
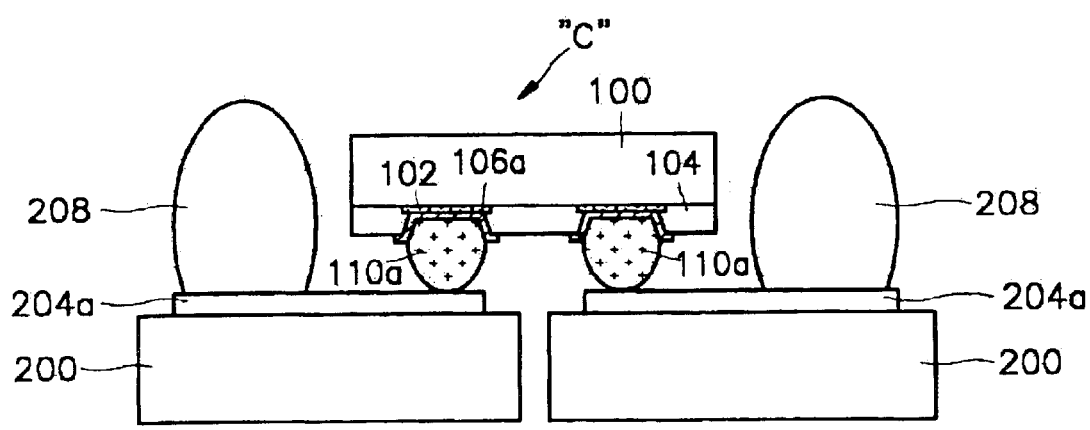
FIG. 16 is a cross-sectional view illustrating a step of flip-chip-bonding an optical device chip to a silicon wafer having a plurality of through holes of FIG. 3.

FIG. 16 is a cross-sectional view illustrating a method of flip-chip-bonding an optical device chip to a silicon wafer having a through hole of FIG. 3. Specifically, optical device chips (C) manufactured by the method described above with reference to FIGS. 4 through 9 are turned over and are arranged on the silicon wafer 200. Next, the solder bump 110a of each of the optical device chip (C) is flip-chip-bonded to the under ball metal layer pattern 204a of the silicon wafer 200. The degree, to which the solder bump 110a is precisely flip-chip-bonded to the under ball metal layer pattern 204a, can be adjusted within a level of 1 micron, taking advantage of the precision of a bonding machine and a solder self-alignment effect. The solder bump 110a of each of the optical device chip (C) is flip-chip-bonded to the under ball metal layer pattern 204a by reflowing the optical device chips (C) by the wafer level.

Next, the silicon wafer 200, on which the optical device chips (C) are formed, is cut, thereby forming optical sub modules. The optical sub modules may be formed by cutting the silicon wafer 200 into individual wafers, on each of which one optical device chip is formed, or cutting the silicon wafer 200 into individual wafers, on each of which an array of four or eight optical device chips is formed for multi-channels.

Hereinafter, a method of coupling an optical sub module with an optical fiber will be described with reference to FIG. 2. Specifically, the optical fiber 301 is inserted into the through hole 202 formed at the back side of a flip-chip-bonded optical sub module and is aligned. The optical fiber 301 may include an optical fiber coated with an optical fiber ferule. A method of passively aligning the optical fiber 301 with the optical device chip (C) by inserting the optical fiber 301 into the through hole 202 without operating the optical device chip (C) can allow the optical device chip (C) to be easily coupled with the optical fiber 301 and maximize the efficiency of the optical device chip (C) to be coupled with the optical fiber 301. The efficiency of the optical device chip (C) to be coupled with the optical fiber 301 can be increased by inserting a lens (at reference 203) into the through hole 202 at the back side of the silicon wafer 200 or filling the through hole 202 with an index matching material (at reference 203), such as epoxy.

As described above, since an optical module package is manufactured using flip chip bonding in the present invention, it is possible to reduce electric parasitic components, which may be generated due to the length of wires used in wire bonding, and satisfy the electrical characteristics of a high speed optical device chip.

In addition, in the present invention, since an optical fiber is inserted into a through hole formed in a silicon wafer to be passively aligned with an optical device chip, it is possible to reduce the time taken to couple the optical device chip with the optical fiber and increase the efficiency of the optical device chip to be coupled with the optical fiber.

What is claimed:

1. A method of packaging an optical module using flip chip bonding, the method comprising:

preparing an optical device chip which is comprised of an input/output pad formed on a substrate, an under bump metal layer formed on the input/output pad, and a solder bump formed on the under bump metal layer to transmit an electric signal to the outside;

preparing a silicon wafer to rearrange input/output terminals of the optical device chip and passively align an optical fiber with the optical device chip;

forming a plurality of through holes in the silicon wafer at predetermined intervals;

forming an under ball metal layer at the surface of the silicon wafer;

forming a solder ball on the under ball metal layer to transmit an electrical signal from the solder bump to the outside;

flip-chip-bonding the optical device chip to the silicon wafer;

manufacturing an optical sub module by cutting the silicon wafer; and optically coupling the optical device chip with the optical sub module by inserting the optical fiber into the through hole of the optical sub module to be aligned with the optical device chip.

2. The method of claim 1, wherein preparing the optical device chip comprises:

manufacturing optical devices each including an input/output pad formed on a substrate;

forming an under bump metal layer on the input/output pad;

forming a solder bump on the under bump metal layer on the input/output pad; and obtaining an individual optical device chip by cutting the substrate, on which the solder bump is formed.

3. The method of claim 1, wherein the through hole is formed by wet-etching or dry-etching the silicon wafer or polishing the back side of the silicon wafer and wet-etching or dry-etching the silicon wafer.

4. The method of claim 1, wherein the silicon wafer is cut into individual wafers, on each of which an array of a plurality of optical device chips is formed.

5. The method of claim 1, wherein the optical fiber is inserted into the through hole of the optical sub module in the manner of passive alignment, in which there is no need to operate an optical device.

* * * * *